United States Patent
Chen et al.

(10) Patent No.: US 11,537,837 B2
(45) Date of Patent: Dec. 27, 2022

(54) AUTOMATED ACCURACY-ORIENTED MODEL OPTIMIZATION SYSTEM FOR CRITICAL DIMENSION METROLOGY

(71) Applicant: KLA-TENCOR CORPORATION, Milpitas, CA (US)

(72) Inventors: Yuerui Chen, Shanghai (CN); Xin Li, Shanghai (CN)

(73) Assignee: KLA-TENCOR CORPORATION, Milpitas, CA (US)

(*) Notice: Subject to any disclaimer, the term of this patent is extended or adjusted under 35 U.S.C. 154(b) by 1369 days.

(21) Appl. No.: 15/883,154

(22) Filed: Jan. 30, 2018

(65) Prior Publication Data

US 2018/0232630 A1   Aug. 16, 2018

Related U.S. Application Data

(60) Provisional application No. 62/458,548, filed on Feb. 13, 2017.

(51) Int. Cl.
| | |
|---|---|
| G06N 3/04 | (2006.01) |
| G06F 17/16 | (2006.01) |
| G06N 3/08 | (2006.01) |
| H01L 21/66 | (2006.01) |
| G03F 7/20 | (2006.01) |
| G01N 21/47 | (2006.01) |
| G01N 21/21 | (2006.01) |

(Continued)

(52) U.S. Cl.
CPC ........... G06N 3/04 (2013.01); G03F 7/70625 (2013.01); G06F 17/16 (2013.01); G06N 3/08 (2013.01); H01L 22/12 (2013.01); H01L 22/20 (2013.01); G01N 21/9501 (2013.01); G01N 2021/213 (2013.01); G01N 2021/479 (2013.01); G06N 20/10 (2019.01)

(58) Field of Classification Search
CPC combination set(s) only.
See application file for complete search history.

(56) References Cited

U.S. PATENT DOCUMENTS

| | | |
|---|---|---|
| 5,608,526 A | 3/1997 | Piwonka-Corle et al. |
| 5,859,424 A | 1/1999 | Norton et al. |
| 6,429,943 B1 | 8/2002 | Opsal et al. |
| 7,478,019 B2 | 1/2009 | Zangooie et al. |
| 7,933,026 B2 | 4/2011 | Opsal et al. |

(Continued)

OTHER PUBLICATIONS

Castillo et al. Functional Networks with Applications A Neural-Based Paradigm, pp. 29-130 (1999). Retrieved from the Internet <URL: https://link.springer.com/book/10.1007/978-1-4615-5601-5 > (Year: 1999).*

(Continued)

*Primary Examiner* — David R Vincent
(74) *Attorney, Agent, or Firm* — Hodgson Russ LLP

(57) ABSTRACT

Techniques and systems for critical dimension metrology are disclosed. Critical parameters can be constrained with at least one floating parameter and one or more weight coefficients. A neural network is trained to use a model that includes a Jacobian matrix. During training, at least one of the weight coefficients is adjusted, a regression is performed on reference spectra, and a root-mean-square error between the critical parameters and the reference spectra is determined. The training may be repeated until the root-mean-square error is less than a convergence threshold.

19 Claims, 8 Drawing Sheets

(51) Int. Cl.
*G01N 21/95* (2006.01)
*G06N 20/10* (2019.01)

(56) References Cited

U.S. PATENT DOCUMENTS

| | | |
|---|---|---|
| 9,915,522 B1 | 3/2018 | Jiang et al. |
| 2010/0138026 A1* | 6/2010 | Kaushal .................. G06N 5/04 706/23 |
| 2012/0022836 A1* | 1/2012 | Ferns .................. G03F 7/70625 703/2 |
| 2013/0338496 A1* | 12/2013 | Hielscher ............. G06K 9/6271 600/425 |
| 2014/0172394 A1 | 6/2014 | Kuznetsov et al. |
| 2014/0222380 A1 | 8/2014 | Kuznetsov et al. |
| 2015/0204664 A1 | 7/2015 | Bringoltz et al. |
| 2018/0314163 A1* | 11/2018 | Liu ......................... G06F 30/20 |

OTHER PUBLICATIONS

Cunha et al. Estimating the redshift distribution of photometric galaxy samples—II. Applications and tests of a new method (2009) Retrieved from the Internet <URL: https://academic.oup.eom/mnras/article/396/4/2379/1031148?login=true> (Year: 2009).*

An et al. The Effects of Adding Noise During Backpropagation Training on a Generalization Performance (Apr. 1, 1996) Retrieved from the Internet <URL: http://cognet.mit.edU/journal/10.1162/neco.1996.8.3.643> (Year: 1996).*

Hermans et al. Memory in linear recurrent neural networks in continuous time (2009) Retrieved from the Internet <URL: https://www.sciencedirect.com/science/article/pii/S0893608009002305?via%3Dihub> (Year: 2009).*

NASA The Basics of Spectral Fitting (2004) (Year: 2004).*

* cited by examiner

Original Model

$$\Delta P \propto WJ = W\nabla_p f(\mathbf{p}_0) =$$

$$\begin{bmatrix} W(\alpha_1, p_1)\frac{\partial \alpha_1}{\partial p_1} & W(\alpha_1, p_2)\frac{\partial \alpha_1}{\partial p_2} & \cdots & W(\alpha_1, p_k)\frac{\partial \alpha_1}{\partial p_k} \\ W(\beta_1, p_1)\frac{\partial \beta_1}{\partial p_1} & W(\beta_1, p_2)\frac{\partial \beta_1}{\partial p_2} & \cdots & W(\beta_1, p_k)\frac{\partial \beta_1}{\partial p_k} \\ W(\alpha_2, p_1)\frac{\partial \alpha_2}{\partial p_1} & W(\alpha_2, p_2)\frac{\partial \alpha_2}{\partial p_2} & \cdots & W(\alpha_2, p_k)\frac{\partial \alpha_2}{\partial p_k} \\ W(\beta_2, p_1)\frac{\partial \beta_2}{\partial p_1} & W(\beta_2, p_2)\frac{\partial \beta_2}{\partial p_2} & \cdots & W(\beta_2, p_k)\frac{\partial \beta_2}{\partial p_k} \\ \vdots & \vdots & \ddots & \vdots \\ W(\alpha_m, p_1)\frac{\partial \alpha_m}{\partial p_1} & W(\alpha_m, p_2)\frac{\partial \alpha_m}{\partial p_2} & \cdots & W(\alpha_m, p_k)\frac{\partial \alpha_m}{\partial p_k} \\ W(\beta_m, p_1)\frac{\partial \beta_m}{\partial p_1} & W(\beta_m, p_2)\frac{\partial \beta_m}{\partial p_2} & \cdots & W(\beta_m, p_k)\frac{\partial \beta_m}{\partial p_k} \end{bmatrix}$$

Result is directed by weighted Jacobian Matrix.
Default weight only depends on hardware's noise.

W_opt=Argmax[Accuracy{W}]

Accuracy is based on reference.
Reference = real reference + synthetic reference with model/system uncertainty

Final Accuracy-oriented model

$$\Delta P \propto W_{opt} J$$

The weight optimized based on critical parameter's accuracy, actually stands for the noise of the critical parameter.

FIG. 3

AUTOMATED ACCURACY-ORIENTED MODEL OPTIMIZATION SYSTEM FOR CRITICAL DIMENSION METROLOGY

CROSS-REFERENCE TO RELATED APPLICATIONS

This application claims priority to the provisional patent application filed Feb. 13, 2017 and assigned U.S. App. No. 62/458,548, the disclosure of which is hereby incorporated by reference.

FIELD OF THE DISCLOSURE

This disclosure relates to metrology techniques.

BACKGROUND OF THE DISCLOSURE

Evolution of the semiconductor manufacturing industry is placing ever greater demands on yield management and, in particular, on metrology and inspection systems. Critical dimensions are shrinking while wafer size is increasing. Economics is driving the industry to decrease the time for achieving high-yield, high-value production. Thus, minimizing the total time from detecting a yield problem to fixing it determines the return-on-investment for the semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Metrology may be used during semiconductor manufacturing to take various measurements of, for example, a semiconductor wafer or reticle. Metrology tools can be used to measure structural and material characteristics associated with various semiconductor fabrication processes. For example, the metrology tools can measure material composition or can measure dimensional characteristics of structures and films such as film thickness, a critical dimension (CD) of structures, or overlay. These measurements are used to facilitate process controls and/or yield efficiencies during the manufacture of semiconductor dies.

As semiconductor device pattern dimensions continue to shrink, smaller metrology targets are often required. Furthermore, the requirements for measurement accuracy and matching to actual device characteristics increase the need for device-like targets as well as in-die and even on-device measurements. Various metrology implementations have been proposed to achieve that goal. For example, focused beam ellipsometry based on primarily reflective optics is one of them. Apodizers can be used to mitigate the effects of optical diffraction causing the spread of the illumination spot beyond the size defined by geometric optics. The use of high-numerical-aperture tools with simultaneous multiple angle-of-incidence illumination is another way to achieve small-target capability.

Other measurement examples may include measuring the composition of one or more layers of the semiconductor stack, measuring certain defects on (or within) the wafer, and measuring the amount of photolithographic radiation exposed to the wafer. In some cases, a metrology tool and algorithm may be configured for measuring non-periodic targets.

Measurement of parameters of interest usually involves a number of algorithms. For example, optical interaction of the incident beam with the sample is modeled using an electro-magnetic (EM) solver and uses such algorithms as rigorous coupled wave analysis (RCWA), finite element modeling (FEM), method of moments, surface integral method, volume integral method, finite-difference time domain (FDTD), and others. The target of interest is usually modeled (parametrized) using a geometric engine a process modeling engine, or a combination of both. A geometric engine is implemented, for example, in the AcuShape software product from KLA-Tencor.

These modeling methods can include modification of fixed or floated parameters; modification of parameter constraint; modification of nominal value of fixed parameters; modification of coordinates of parameter space; selection or weighting of a subsystem or channel; wavelength selection or weighting; multi-pass; data feedforward; multi-model; and modification of a regression engine.

During model optimization process, tens or even hundreds of configurations for each method are tried manually, and the combinations of all method configurations are numerous. This process could be named "trial-error" because it minimizes model and reference error by trying.

Scatterometry critical dimension (SCD) is a model-based, indirect methodology. SCD models need to be optimized to get best accuracy, such as to match references from a critical dimension scanning electron microscope (CD-SEM), critical dimension transmission electron microscope (CD-TEM), and/or process condition. FIG. 1 shows current workflow of SCD model optimization. In this workflow, several modeling methods could be used to realize best accuracy.

FIG. 2 shows current workflow of an optical critical dimension (OCD) model optimization in AcuShape, an offline modeling software for OCD measurement. In this procedure, OCD model is trained to match a reference by adjusting multiple inputs (fixed parameters, constraint equations, and material dispersion (NK), etc.) many times.

These previous techniques may be effective when a model structure is simple and could deliver "best" accurate model fast. However, as the OCD targets become more complex, the "trial-error" method's limitation emerges. Complex model having more configurations could be modified, which makes combination number huge. In this condition, the "trial-error" method may take a few weeks to get a "best" accurate model. Most efforts during this lengthy time period are ineffective, and the final model cannot be assured to be the best.

Therefore, improved metrology techniques and associated systems are needed.

BRIEF SUMMARY OF THE DISCLOSURE

In a first embodiment, a method is provided. The method comprises initializing a model that includes a Jacobian matrix using a processor. The initializing includes spectra fitting. Critical parameters are constrained, using the processor, with at least one floating parameter and one or more weight coefficients. Using the processor, a neural network is trained to use the model. The training includes: adjusting at least one of the weight coefficients; performing a regression on reference spectra; determining a root-mean-square error between the critical parameters and the reference spectra; and repeating the adjusting, the performing, and the determining until the root-mean-square error is less than a convergence threshold.

The constraining can use a linear function or a nonlinear function. If a nonlinear function is used, the constraining may be performed with a single layer neural network or a multi-layered neural network.

The method can further include obtaining the one or more weight coefficients from a database.

The reference spectra may be synthetic or may be obtained from a semiconductor wafer.

In an instance, the method further includes setting an error index for the convergence threshold. The method can further include defining a regularization item. The regularization item may be an inverse of an autocorrelation length. The autocorrelation length may be one of the weight coefficients along a wavelength direction. Adjusting the weight function can include using an overall cost function. The overall cost function is a sum of the error index and the regularization item.

Adjusting the weight function may be configured to avoid over-fitting. The weight function may be equal to noise. The noise may be continuous along a wavelength or parameter direction.

A computer program product comprising a non-transitory computer readable storage medium having computer readable program embodied therewith may be provided. The computer readable program may be configured to carry out any of the embodiments of the method in the first embodiment.

In a second embodiment, a system is provided. The system comprises a processor in electronic communication with an electronic data storage unit and a wafer metrology tool. The processor is configured to initialize a model in a manner that includes spectra fitting. The model includes a Jacobian matrix. The processor is further configured to constrain critical parameters with at least one floating parameter and one or more weight coefficients, and to train a neural network to use the model. The training includes: adjusting at least one of the weight coefficients; performing a regression on reference spectra; determining a root-mean-square error between the critical parameters and the reference spectra; and repeating the adjusting, the performing, and the determining until the root-mean-square error is less than a convergence threshold.

The constraining can use a linear function or a nonlinear function. If the constraining uses a nonlinear function, the constraining may be performed with a single layer neural network or a multi-layered neural network.

The processor may be further configured to obtain the one or more weight coefficients from a database in the electronic data storage unit.

The reference spectra may be obtained from a semiconductor wafer in the wafer metrology tool.

The processor may be further configured to set an error index for the convergence threshold.

DESCRIPTION OF THE DRAWINGS

For a fuller understanding of the nature and objects of the disclosure, reference should be made to the following detailed description taken in conjunction with the accompanying drawings, in which:

FIG. 3 is a flowchart of a workflow embodiment in accordance with the present disclosure.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein create an automated and accuracy-oriented model optimization system for critical dimension metrology that can be used in the semiconductor industry. The embodiments disclosed herein can provide a new technique (Train Weight For X-parameter (TWFX)) to optimize an OCD model for improved accuracy with reference data. The automated algorithm can maximize the accuracy. Embodiments of the optimization method can provide a more accurate OCD model.

The optimized objective may be numerically defined.

Error=Pooled(Error_wRef,Error_woRef,precision, matching)

Error_wRef=Pooled(RMSE(differentCP@oneSite)+ RMSE(sameCP@differentSites))

Error_woRef=1−correlation(wafermap$A$,wafermap$B$)
($WtW$ consistency)

These equations are defined using variables explained herein.

The optimization technique may be through the weighting space. The optimization technique also can be implemented through either parameter space or signal space.

FIG. 3 illustrates an embodiment of a workflow. In FIG. 3, W($\alpha$n,pn) is weighting for each Jacobian component, an and $\beta$n are spectra signals, and pn is a parameter in the model. The workflow (1) defines the SCD modeling goal, including all previous methods' targets as "Maximize Accuracy" (or "Minimize Error"), (2) generalizes the OCD modeling's method, including all previous methods' actions as "tuning Weight function of the Jacobian Matrix", and (3) gives a general starting for accuracy-oriented model optimization to find the Weight function (W), which satisfies the following equation.

$W\_opt$=Argmax[Accuracy($W$)]

W_opt is an optimized weighting. Accuracy (W) is an accuracy function. Argmax means arguments of the maxima. Argmax[Accuracy (W)] may mean solving W and letting the Accuracy (W) function value be maximized.

This is a general solution in OCD modeling to get a weight function from reference data, which can provide a faster delivery speed and a better result than the previous "trial-error" methodology.

Figure 1:
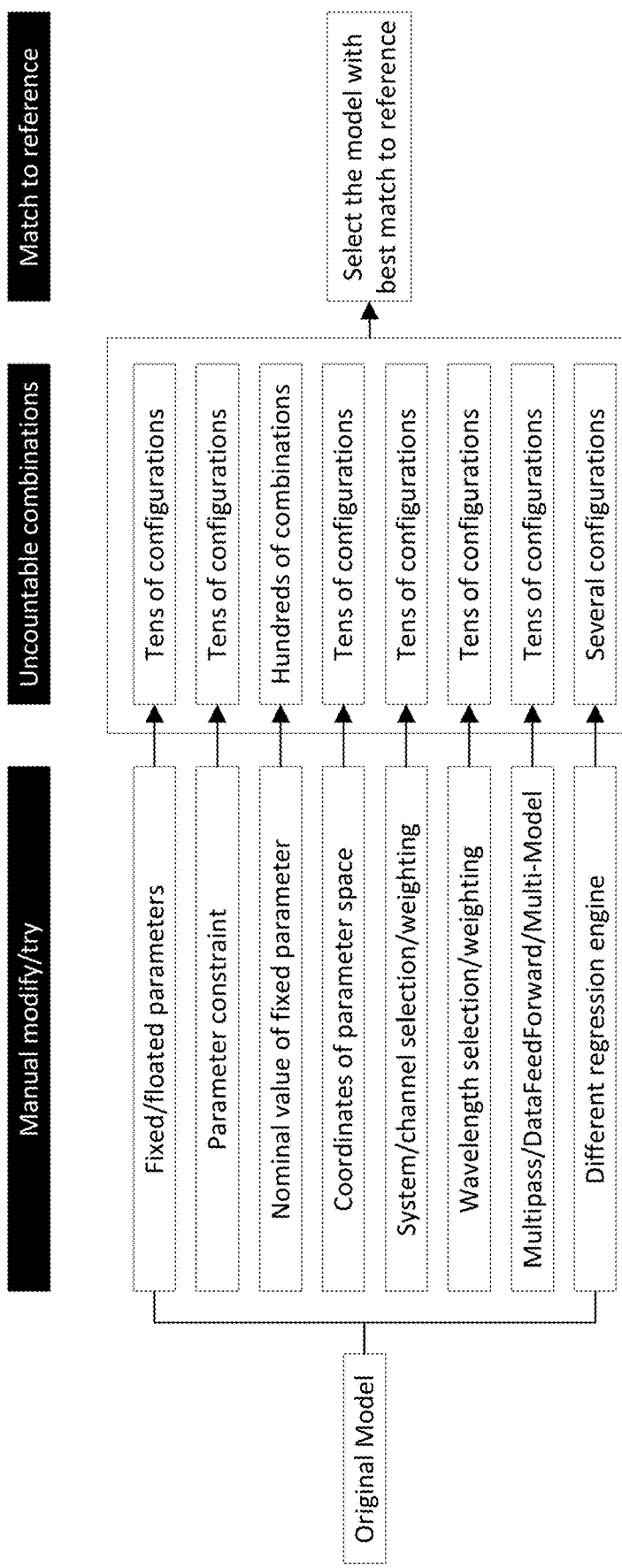
FIG. 1 is a flowchart of a workflow for SCD.
Figure 2:
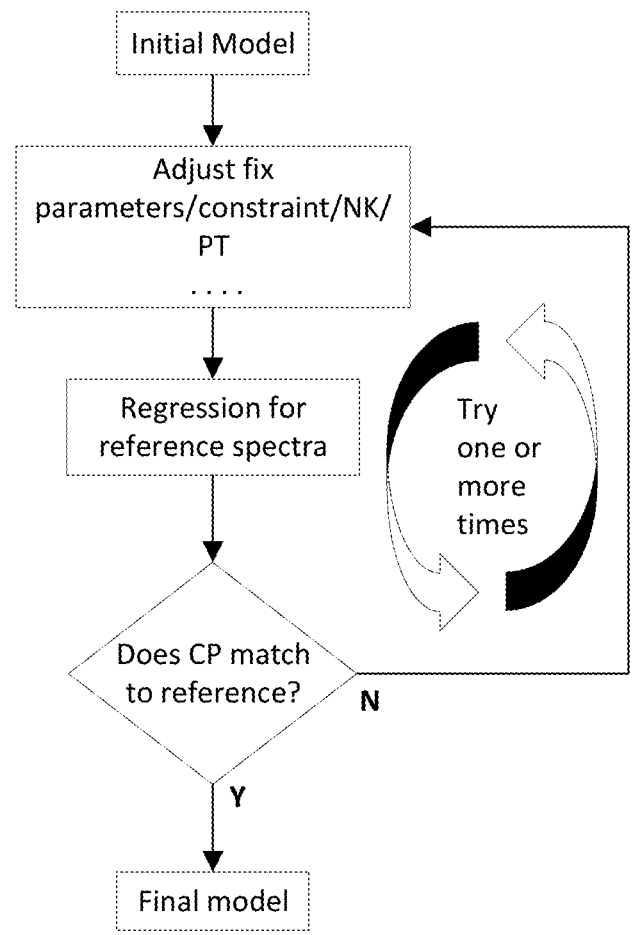
FIG. 2 is a flowchart of a workflow for OCD model optimization.
Figure 4:
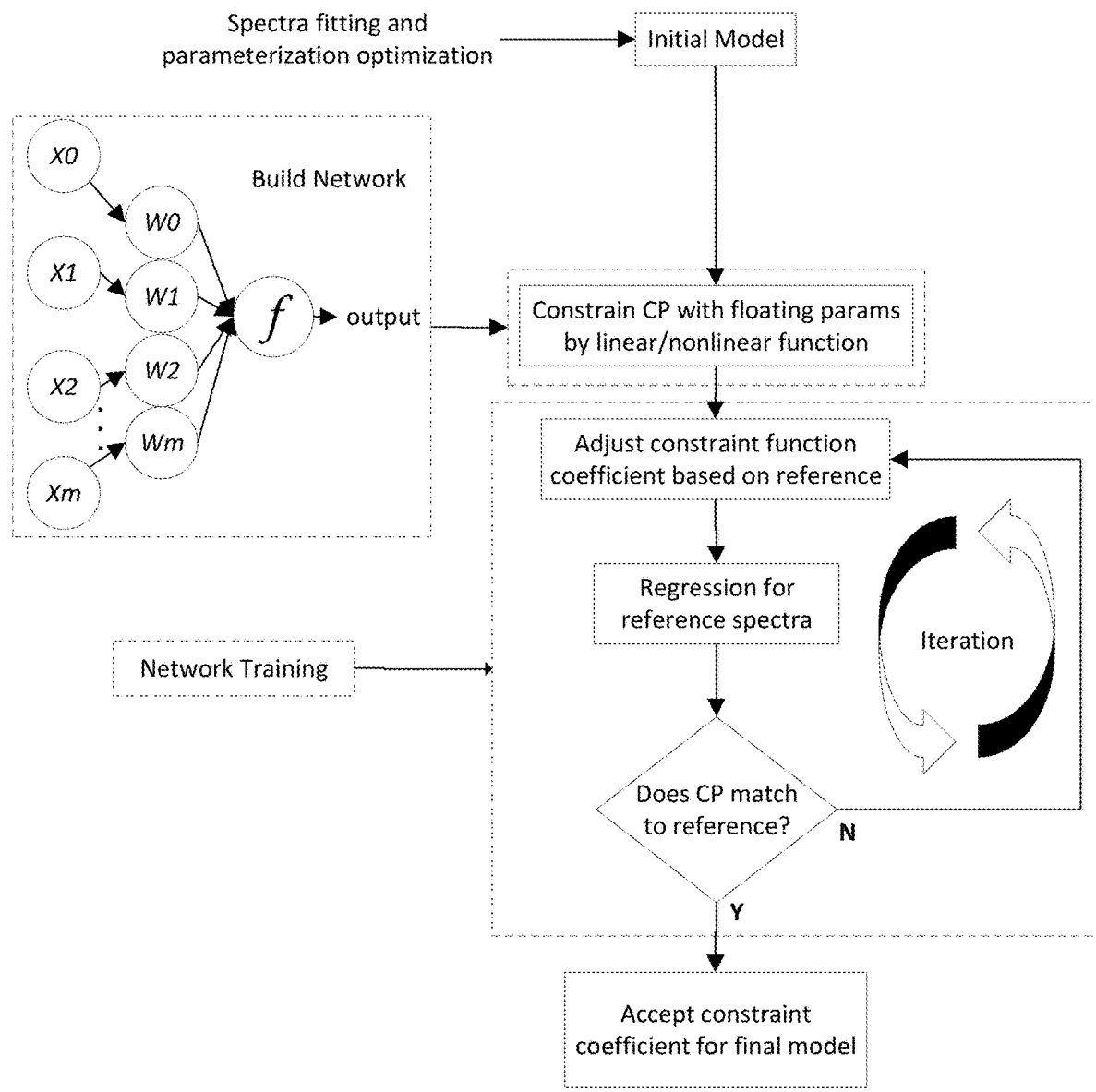
FIG. 4 is a flowchart of an embodiment of an implementation to optimize an OCD model in accordance with the present disclosure.

FIG. 4 illustrates an embodiment of an implementation to optimize an OCD model. TWFX is an implementation to optimize OCD model to achieve best accuracy with reference data. In the embodiment of FIG. 4, a neural network is built using a critical parameter (CP) constraint equation, which is implanted into an OCD model.

$$CP = f\left(\sum_{i=0}^{n} W_i X_i\right)$$

Here $X_i$ is floating parameter, $W_i$ is a weight (coefficient) of $X_i$, and f( ) could be a linear or nonlinear function.

The neural network is then trained. This can train the critical parameter constraint equation based on reference and regression result in each iteration by adjusting the weight (coefficient) $W_i$.

A criterion of iteration exiting can be set. For example, root-mean-square error between the critical parameter and reference may be less than threshold or convergence.

Figure 5:
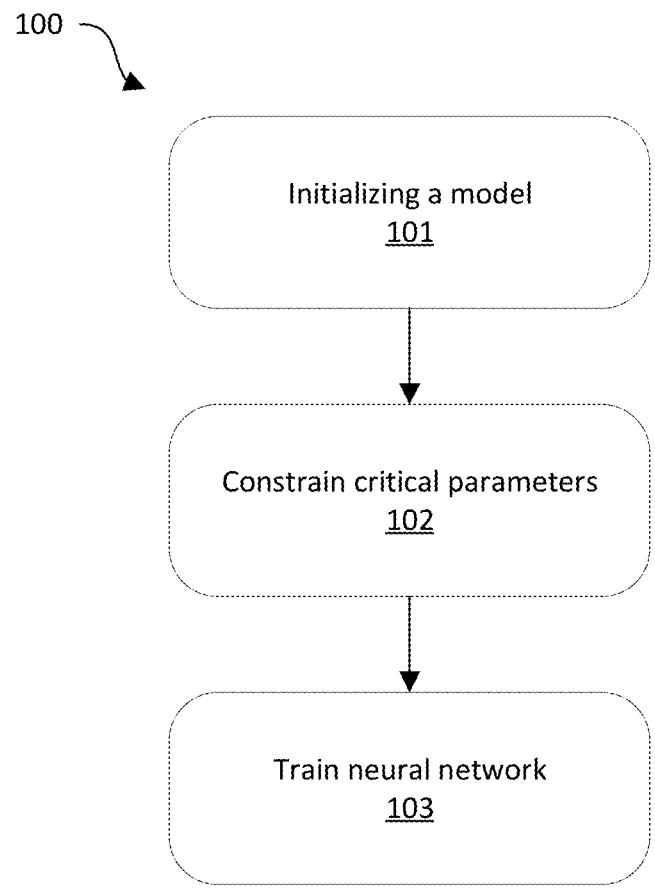
FIG. 5 is a flowchart of another embodiment of a method in accordance with the present disclosure.

FIG. 5 illustrates an embodiment of a method 100. Some or all of the steps in the method 100 can be performed by a processor. At 101, a model is initialized. The model includes a Jacobian matrix. The initialization includes spectra fitting. Spectra fitting can be based on minimizing a chi-squared distribution or based on minimizing root-mean-square error.

At 102, critical parameters are constrained with at least one floating parameter and one or more weight coefficients. The floating parameters are parameters that are floated in the model. The floating parameters may be geometric parameters, dispersion parameters, or other types of parameters. For the same model with different spectra, different spectra correspond to different values of floating parameters after fitting. The constraining can use a linear function or a nonlinear function. An example of the linear function is shown below.

$$CP = b + w1*X1 + w2*X2 + w3*X3 + \ldots + wn*Xn$$

In the equation above, Xn is the floating parameter, CP is a critical parameter, b is an intercept of linear function, and wn is weighting for each floating parameter Xn. If a nonlinear function is used, the constraining may be performed with a single layer neural network or a multi-layered neural network. The one or more weight coefficients may be obtained from a database.

A neural network is trained at 103 to use the model. The training at 103 can include the following steps. First, at least one of the weight coefficients is adjusted. Second, a regression is performed on reference spectra, which may be synthetic or may be obtained from one or more semiconductor wafers. Third, a root-mean-square error between the critical parameters and the reference spectra is determined. These steps can be repeated until the root-mean-square error is less than a convergence threshold. In an instance, root-mean-square error can be defined as the error between a critical parameter and reference data. In this instance, the convergence threshold is to determine if error meets the minima.

The model and hardware configuration can be optimized based on accuracy. Automatically adjusting to different best configurations (e.g., wavelength, channel) can be performed under different process windows of one device. For example, all of the configurations can be put into a Jacobian matrix as Jacobian matrix elements. Weightings can be optimized for these configurations of Jacobian matrix elements based on accuracy orientation. Accuracy (e.g., reference match, consistency, precision, tool-tool match) can be optimized automatically.

Synthetic spectra can be generated with an accurate critical dimension value for critical parameters; a perturbed critical dimension value for non-critical, fixed, or constrained parameters; or a perturbed system setting.

The weight coefficient may be optimized for accuracy, such as to provide best matching to a given reference.

Adjusting the weight coefficients may be configured to avoid over-fitting. For example, the weight function may be equal to noise and the noise may be continuous along a wavelength or parameter direction. Using real reference samples and synthetic reference samples with corresponding model or system uncertainty may reduce over-fitting.

Optimizing the coefficients in parameter constraints or the weighting in wavelength samples can be performed.

The number of passes can be set. A default may be one pass, but more passes can be added. This may mean that multiple weighting layers are optimized and used in validation one by one. In an instance, assume the optimization is in an n-dimension space. A first pass can include optimization searches of the path directly from the full n-D space. If the pass number is greater than one, it means in each time of the pass the space dimension is less than n. For example, in a 3D xyz space, the path directly in the 3D xyz space (first pass) can be searched. In another example, the path is searched first in xy-plane at z=0 (first pass), then x is fixed at the value obtained in the first pass, and then search the following path in yz-plane (second pass).

The noise level can be set. This may be set according to model or system setting uncertainties. By default, the noise level may be decided based on lamp intensity of the metrology tool. Thus, the noise level may be a system setting. A value of the noise level can be applied to each Jacobian element, same as with the weight coefficient for each Jacobian element. The noise level also can be set based on model result if a target for accuracy is known or determined.

A dimension of the weight coefficient can be set. The weight coefficient may be set to reduce optimizing time and/or avoid overfitting. In an example, a unit distance of the element of the weight matrix is set along wavelength and along each parameter. All weight coefficients can be linked under the same channel and/or subsystem. Linked can mean, for different Jacobian elements, that weights are set with same value. This value can be adjusted, but may be same for those elements. For example, the weights for Jacobian elements can be linked on an mth-row, then all the weights on this row will be the same value during adjusting.

All weight coefficients also can be linked under the same wavelength or parameter. Weight coefficients can be constrained based on an input parameter constraint. For example, if P2 is constrained to P1 then $W(p2) = W_{origin}(p2) \delta P1/\delta P2$. The variable P can be a parameter for geometry or a material's optical properties in the model. Generally, P is one dimension of the parameter space of the model. Weight coefficients constraints can be loaded from a file, such as a txt file.

Overfitting can be avoided using multiple techniques. For example, the number of samples may be increased. This may include more reference or synthetic data. In another example, the weight coefficient's freedom can be decreased. The general physic constraint is that a weight coefficient is equal to noise and noise is continuous along a wavelength or parameter direction. In yet another example, another machine learning algorithm besides a neural network for hyperspace, such as support-vector machines (SVM), may be used. In yet another example, a multi-step process is used. In a first step, high weight coefficient freedom and more synthetic samples are used to generate big data (e.g., synthetic spectra with model and/or system uncertainty). In a second step, freedom of the weight coefficient is decreased by parameter transformation. This can be summarized to a fitting or machine learning problem. In a third step, the weight coefficient's freedom is gradually increased after a reference until the accuracy is approached.

An error index for the convergence threshold may be set and a regularization item may be defined. The regularization item may be an inverse of an autocorrelation length. The autocorrelation length may be one of the weight coefficients along a wavelength direction. In this instance, adjusting the weight function can include using an overall cost function. The overall cost function may be a sum of the error index and the regularization item.

A general form of a weight coefficients is as follows.

$$\Delta P \propto \sum_n W_n J_n$$

In this formula, n is the nth subsystem. With n subsystems, $J_n$ is the Jacobian matrix of the nth subsystem, and $W_n$ is the corresponding weight of that subsystem. Then the overall $\Delta P$ is proportional to the weighted sum of those subsystems. Furthermore, W_opt=Argmax[Accuracy (W)], where accuracy is defined by the error index.

In an instance, accuracy is maximized, which may be equal to minimizing error. Error can be defined using different techniques. Error may be the distance between a reference and a model-predict (e.g., a single site, single critical dimension case). Error also may be the root-mean-square error of a group of error value (e.g., a multi-site, multi-critical dimension). Error also may be total measurement uncertainty (TMU), which is pooled uncertainty that includes reference-predict error, precision, and tool-tool matching. Error also may be defined using other statistical properties such as wafer-wafer map inconsistency (=1−(correlation(wafermap1, wafermap2))). This is a proposed error definition of a wafer-to-wafer map inconsistency. Considering process consistency, wafer1 and wafer2 may have consistency distribution across the wafer for parameters like film thickness, so consistency between these two wafers can be calculated using correlation(wafermap1, wafermap2). Then wafer to wafer map inconsistency equals 1−(correlation(wafermap1, wafermap2)).

In an instance, Error=Pooled(Error_wRef, Error_woRef, precision, matching). Error_wRef=Pooled(RMSE (differentCP@oneSite)+RMSE(sameCP@differentSites)). Error_woRef=1−correlation(wafermapA, wafermapB) (WtW consistency). Pooled (A,B,C) is Sqrt ((A^2+B^2+C^2)/3). RMSE is root-mean-square error. differentCP@onesite are errors of all critical parameters of one measurement. sameCP@differentSites are errors of one critical parameter for all measurements. Error_wRef is an error between the model-predicted value and the reference value. Error_woRef is error not calculated from reference value, but from assumed consistency. Assume the distribution of parameter on waferA and wafermapB should be the same based on process condition, then the correlation should be 1, and error_woRef should be 0. Precision is variation of predicted values from repetitive measurement. Matching is variation of predicted values of same target but different tools.

W_opt can be determined using various techniques. In an example, a local approach is used. A stochastic gradient descent can be used, which can include a similar method such as iterative approximation by linear and/or neural network fitting. This may have the following formula.

$$\Delta W \propto \frac{\partial \text{Error}_w}{\partial W}$$

W_opt is W_initial+ΔW1+ΔW2+ . . . , until the convergence spec is reached. ΔWn: ΔW of the nth step, which can be calculated from the local gradient.

In another example, a more global approach is used. The search path is rewarded based on the final accuracy between prediction/reference and summarizing the total reward at each point as the corresponding weight. The noise level during spectra fitting in a global search can be defined by both hardware noise and model-introduced uncertainty.

In an embodiment, a developed construction can be a combination of multi-target and optimized weight functions. The optimized weight function can be used for directing regression (e.g., to filter the unrelated signal) and multi-target can be used for increased sensitivity (e.g., enhancing the related signal) or for a tool-tool matching case. Multi-target can mean combining signals (e.g., spectra) from different targets as one spectra, while setting some of the parameters among the different targets to be the same. It can lead to an expansion of the Jacobian matrix. Ordinary multi-target may use same weight for each target. A combination of multi-target and optimized weight functions can mean that each target has different weight, or more generally in the expanded Jacobian matrix that each element can have a different weight.

Figure 6:
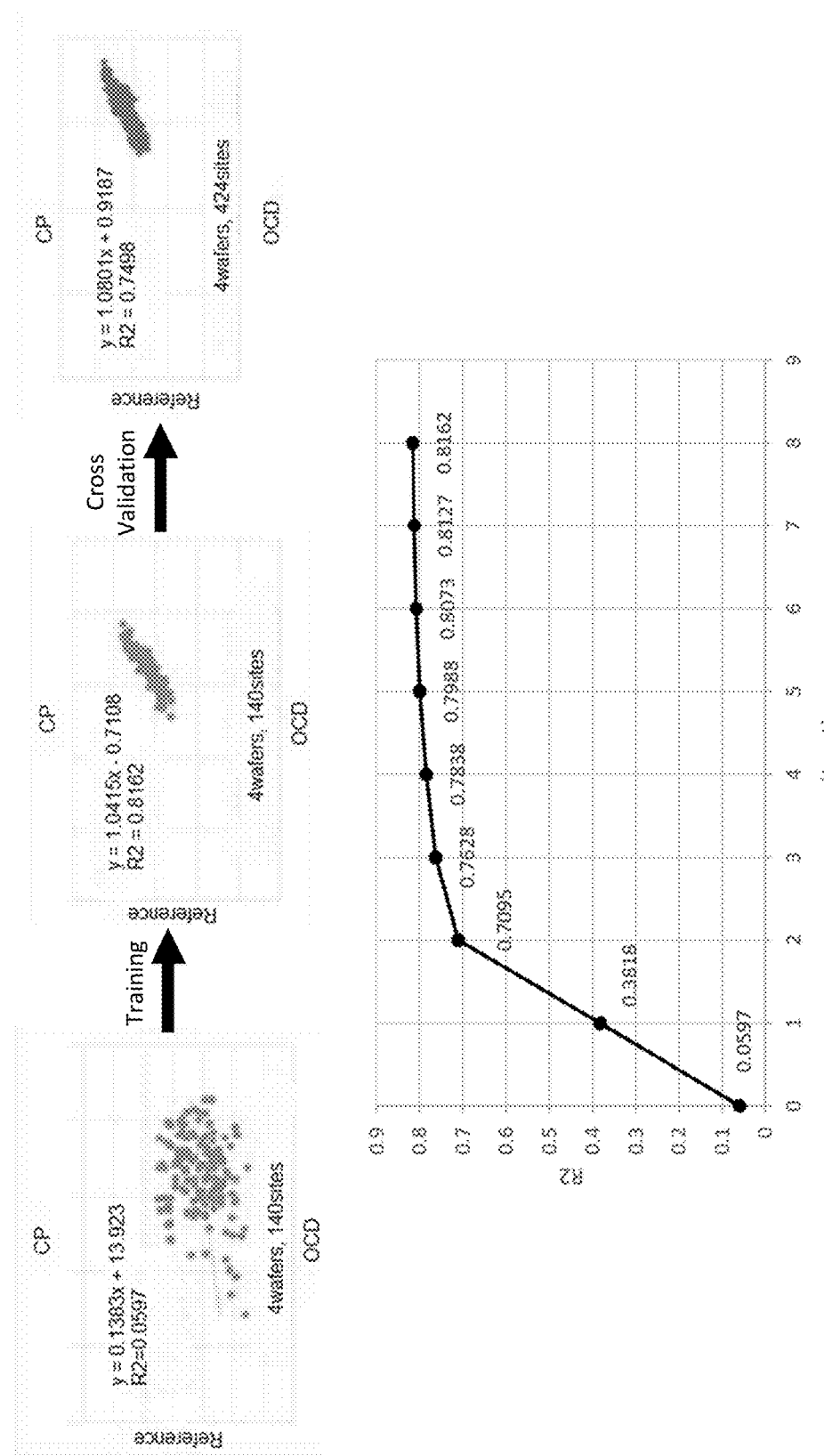
FIG. 6 illustrates the results of an embodiment of the present disclosure.

In an example, a general automated OCD modeling method is provided. This example is not meant to be limiting. FIG. 6 shows the results of this example. Library validation was performed so that the time of weight coefficient optimization was in an acceptable range.

A reference was inputted and the weight coefficient was optimized during an iteration of library validation. The weight coefficient matrix was saved to a file. This file had a similar role to the multi-pass xml file. The optimized weight coefficient matrix was then validated.

In one implementation of critical parameter metrology on four wafers, 424 sites reference data are used. The TWFX method disclosed herein with nine degrees of freedom and a linear function was used to train one or more references for 140 sites. After approximately six iterations, a correlation of reference (R2) converged to approximately 0.81. A total of 424 sites were used for validation and resulted in R2 of approximately 0.75, as seen in FIG. 6.

This technique can be used for not only reference matching, but also precision, stability, matching, or layer-to-layer consistency.

Figure 7:
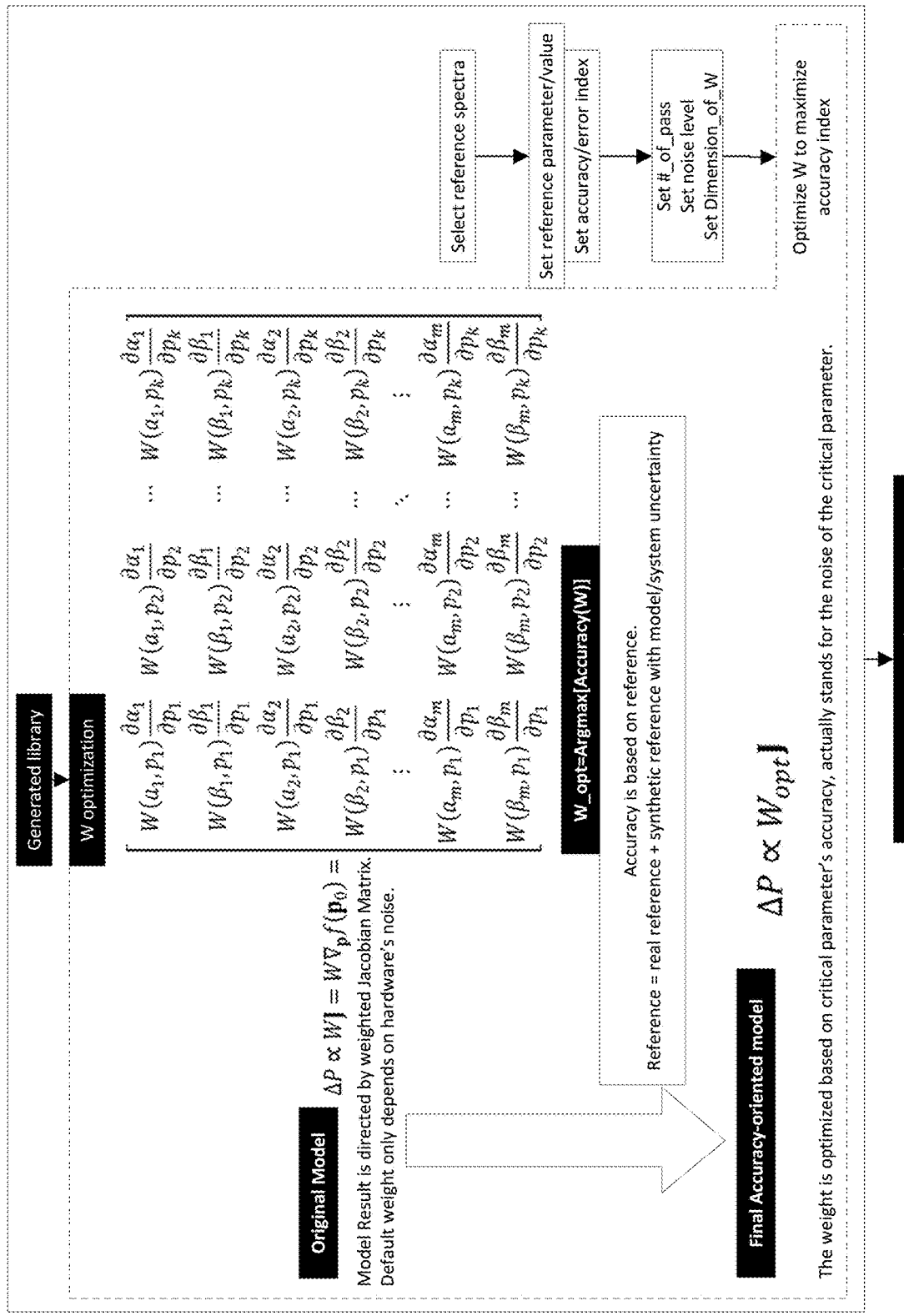
FIG. 7 is another example of a workflow in accordance with the present disclosure.

FIG. 7 is an example of a workflow. FIG. 3 is the explanation of the weighting optimization workflow by Jacobian Matrix. FIG. 7 is the implementation in library validation using the method of FIG. 3.

Figure 8:
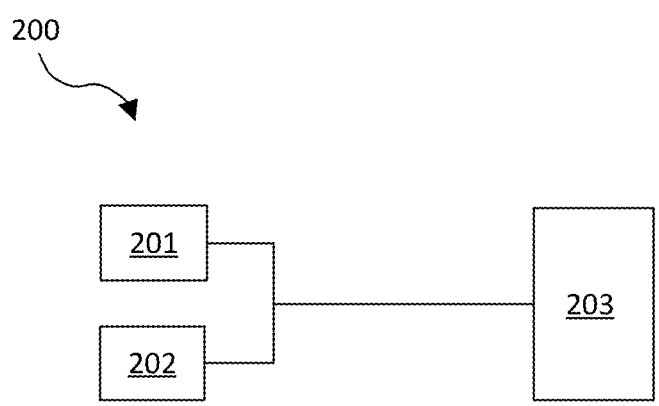
FIG. 8 is a block diagram of a system in accordance with the present disclosure.

FIG. 8 is a block diagram of a system 200. The system includes a processor 201 and an electronic data storage unit 202 in electronic communication with the processor 201. The processor 201 and the electronic data storage unit 202 are in electronic communication with the wafer metrology tool 203. The processor 201 may include a microprocessor, a microcontroller, or other devices. A wafer metrology tool 203 can generate information used by the processor 201.

The processor 201 and electronic data storage unit 202 may be part of the wafer metrology tool 203 or another device. In an example, the processor 201 and electronic data storage unit 202 may be part of a standalone control unit or in a centralized quality control unit. Multiple processors 201 or electronic data storage unit 202 may be used.

The processor 201 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 201 to implement various methods and functions may be stored in readable storage media, such as a memory in the electronic data storage unit 202 or other memory.

The processor 201 may be coupled to the components of the system 200 in any suitable manner (e.g., via one or more transmission media, which may include wired and/or wireless transmission media) such that the processor 201 can receive output. The processor 201 may be configured to perform a number of functions using the output.

The processor 201, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

An additional embodiment relates to a non-transitory computer-readable medium storing program instructions executable on a processor for performing a computer-implemented metrology, as disclosed herein. In particular, the processor 201 can be coupled to a memory in the electronic data storage unit 202 or other electronic data storage medium with non-transitory computer-readable medium that includes program instructions executable on the processor 201. The computer-implemented method may include any step(s) of any method(s) described herein. For example, the processor 201 may be programmed to perform some or all of the steps of FIGS. 3-5 or other embodiments disclosed herein. The memory in the electronic data storage unit 202 or other electronic data storage medium may be a storage medium such as a magnetic or optical disk, a magnetic tape, or any other suitable non-transitory computer-readable medium known in the art. In particular, the electronic data storage unit 202 can include persistent storage, random access memory, or a split database.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), SSE (Streaming SIMD Extension), or other technologies or methodologies, as desired.

In an embodiment, the processor 201 initializes a model that includes a Jacobian matrix in a manner that includes spectra fitting. Critical parameters are constrained with at least one floating parameter and one or more weight coefficients. A neural network is then trained to use the model. The training can include adjusting at least one of the weight coefficients; performing a regression on reference spectra; and determining a root-mean-square error between the critical parameters and the reference spectra. The adjusting, performing, and determining steps may be repeated until the root-mean-square error is less than a convergence threshold.

The constraining can use a linear function or a nonlinear function. If the constraining uses a nonlinear function, the constraining may be performed with a single layer neural network or a multi-layered neural network.

The processor may be further configured to obtain the one or more weight coefficients from a database in the electronic data storage unit.

The reference spectra may be obtained from a semiconductor wafer in the wafer metrology tool.

The processor may be further configured to set an error index for the convergence threshold.

The wafer metrology tool 203 may include an illumination system which illuminates a target; a collection system which captures relevant information provided by the illumination system's interaction (or lack thereof) with a target, device, or feature; and a processing system which analyzes the information collected using one or more algorithms.

The wafer metrology tool 203 can include one or more hardware configurations which may be used to measure the various semiconductor structural and material characteristics. Examples of such hardware configurations include, but are not limited to, a spectroscopic ellipsometer (SE); an SE with multiple angles of illumination; an SE measuring Mueller matrix elements (e.g., using rotating compensator(s)); a single-wavelength ellipsometers; a beam profile ellipsometer (angle-resolved ellipsometer); a beam profile reflectometer (angle-resolved reflectometer); a broadband reflective spectrometer (spectroscopic reflectometer); a single-wavelength reflectometer; an angle-resolved reflectometer; an imaging system; or a scatterometer (e.g., speckle analyzer). The hardware configurations can be separated into discrete operational systems or can be combined into a single tool.

The illumination system of certain hardware configurations can include one or more light sources. The light source may generate light having only one wavelength (i.e., monochromatic light), light having a number of discrete wavelengths (i.e., polychromatic light), light having multiple wavelengths (i.e., broadband light), and/or light the sweeps through wavelengths, either continuously or hopping between wavelengths (i.e., tunable sources or swept source). Examples of suitable light sources are: a white light source, an ultraviolet (UV) laser, an arc lamp or an electrode-less lamp, a laser sustained plasma (LSP) source, a supercontinuum source such as a broadband laser source, shorter-wavelength sources such as x-ray sources, extreme UV sources, or some combination thereof. The light source may also be configured to provide light having sufficient brightness, which in some cases may be a brightness greater than about 1 W/(nm cm$^2$ Sr). The wafer metrology tool 203 may also include a fast feedback to the light source for stabilizing its power and wavelength. Output of the light source can be delivered via free-space propagation, or in some cases delivered via optical fiber or light guide of any type.

The wafer metrology tool 203 may be designed to make many different types of measurements related to semiconductor manufacturing. For example, in certain embodiments the wafer metrology tool 203 may measure characteristics of one or more targets, such as critical dimensions, overlay, sidewall angles, film thicknesses, or process-related parameters (e.g., focus and/or dose). The targets can include certain regions of interest that are periodic in nature, such as gratings in a memory die. Targets can include multiple layers (or films) whose thicknesses can be measured by the wafer metrology tool 203. Targets can include target designs placed (or already existing) on the semiconductor wafer for use, such as with alignment and/or overlay registration operations. Certain targets can be located at various places on the semiconductor wafer. For example, targets can be located within the scribe lines (e.g., between dies) and/or located in the die itself. In certain embodiments, multiple targets are measured (at the same time or at differing times) by the same or multiple metrology tools. The data from such measurements may be combined. Data from the metrology tool is used in the semiconductor manufacturing process, for example, to feed-forward, feed-backward and/or feed-sideways corrections to the process (e.g., lithography, etch) and therefore, can yield a complete process control solution.

Collected data can be analyzed by a number of data fitting and optimization techniques and technologies including: libraries; fast-reduced-order models; regression; machine-learning algorithms such as neural networks and SVM; dimensionality-reduction algorithms such as principal component analysis (PCA), independent component analysis (ICA), and local-linear embedding (LLE); sparse representation such as Fourier or wavelet transform; Kalman filter; algorithms to promote matching from same or different tool types, and others. Collected data can also be analyzed by algorithms that do not include modeling, optimization and/or fitting.

Computational algorithms are usually optimized for metrology applications with one or more approaches being used such as design and implementation of computational hardware, parallelization, distribution of computation, load-balancing, multi-service support, or dynamic load optimization. Different implementations of algorithms can be done in firmware, software, field programmable gate array (FPGA), and programmable optics components, etc.

The data analysis and fitting steps usually pursue one or more goals. For example, the goal may be measurement of CD, sidewall angle (SWA), shape, stress, composition, films, bandgap, electrical properties, focus/dose, overlay, generating process parameters (e.g., resist state, partial pressure, temperature, and focusing model), and/or any combination thereof. The goal may be modeling and/or design of metrology systems. The goal also may be modeling, design, and/or optimization of metrology targets.

Embodiments of the present disclosure address the field of semiconductor metrology and is not limited to the hardware, algorithm/software implementations and architectures, and use cases summarized above.

As used herein, the term "wafer" generally refers to substrates formed of a semiconductor or non-semiconductor material. Examples of such a semiconductor or non-semiconductor material include, but are not limited to, monocrystalline silicon, gallium nitride, gallium arsenide, indium phosphide, sapphire, and glass. Such substrates may be commonly found and/or processed in semiconductor fabrication facilities.

A wafer may include one or more layers formed upon a substrate. For example, such layers may include, but are not limited to, a photoresist, a dielectric material, a conductive material, and a semiconductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable patterned features or periodic structures. Formation and processing of such layers of material may ultimately result in completed devices. Many different types of devices may be formed on a wafer, and the term wafer as used herein is intended to encompass a wafer on which any type of device known in the art is being fabricated.

Other types of wafers also may be used. For example, the wafer may be used to manufacture LEDs, solar cells, magnetic discs, flat panels, or polished plates. Measurements of other objects, such as reticles, also may be classified using techniques and systems disclosed herein.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
    initializing a model that includes a Jacobian matrix using a processor, wherein the initializing includes spectra fitting;
    constraining critical parameters, using the processor, with at least one floating parameter and one or more weight coefficients; and
    training, using the processor, a neural network to use the model, wherein the training includes:
        adjusting at least one of the one or more weight coefficients based on accuracy of the critical parameters;
        performing a regression on data for a reference spectra thereby filtering a signal in the reference spectra;
        determining a root-mean-square error between the critical parameters and the data for the reference spectra after performing the regression; and
        repeating the adjusting, the performing, and the determining until the root-mean-square error is less than a convergence threshold.

2. The method of claim 1, wherein the constraining uses a linear function.

3. The method of claim 1, wherein the constraining uses a nonlinear function.

4. The method of claim 3, wherein the constraining is performed with a single layer of the neural network.

5. The method of claim 3, wherein the constraining is performed with multiple layers of the neural network.

6. The method of claim 1, further comprising obtaining the one or more weight coefficients from a database.

7. The method of claim 1, wherein the reference spectra are synthetic spectra generated for a critical dimension value or a system setting.

8. The method of claim 1, wherein the reference spectra are obtained from a semiconductor wafer.

9. The method of claim 1, further comprising setting the convergence threshold.

10. The method of claim 9, further comprising defining a regularization item, wherein the regularization item is an inverse of an autocorrelation length, and wherein the autocorrelation length is one of the one or more weight coefficients along a wavelength or parameter direction.

11. The method of claim 10, wherein the adjusting the one or more weight coefficients includes using an overall cost function.

12. The method of claim 1, wherein the adjusting the one or more weight coefficients is configured to avoid overfitting.

13. A computer program product comprising a non-transitory computer readable storage medium having computer readable program embodied therewith, the computer readable program configured to carry out the method of claim 1.

14. A system comprising:
a processor in electronic communication with an electronic data storage unit and a wafer metrology tool, wherein the processor is configured to:
  initialize a model in a manner that includes spectra fitting, wherein the model includes a Jacobian matrix;
  constrain critical parameters with at least one floating parameter and one or more weight coefficients; and
  train a neural network to use the model, wherein the training includes:
    adjusting at least one of the one or more weight coefficients based on accuracy of the critical parameters;
    performing a regression on data for a reference spectra thereby filtering a signal in the reference spectra;
    determining a root-mean-square error between the critical parameters and the data for the reference spectra after performing the regression; and
    repeating the adjusting, the performing, and the determining until the root-mean-square error is less than a convergence threshold.

15. The system of claim 14, wherein the constraining uses a linear function or a nonlinear function.

16. The system of claim 15, wherein constraining uses a nonlinear function, and wherein the constraining is performed with a single layer of the neural network or multiple layers of the neural network.

17. The system of claim 14, wherein the processor is further configured to obtain the one or more weight coefficients from a database in the electronic data storage unit.

18. The system of claim 14, wherein the reference spectra are obtained from a semiconductor wafer in the wafer metrology tool.

19. The system of claim 14, wherein the processor is further configured to set the convergence threshold.

* * * * *